United States Patent [19]

Yang et al.

[11] Patent Number: 5,450,023
[45] Date of Patent: Sep. 12, 1995

[54] INTERFACE CIRCUIT USING A LIMITED NUMBER OF PINS IN LSI APPLICATIONS

[75] Inventors: Weikang Yang; Guoliang Shou; Sunao Takatori; Makoto Yamamoto, all of Tokyo, Japan

[73] Assignees: Yozan Inc., Tokyo; Sharp Corporation, Osaka, both of Japan

[21] Appl. No.: 228,903

[22] Filed: Apr. 18, 1994

[51] Int. Cl.$^6$ .......................................... H03K 19/094
[52] U.S. Cl. ........................................ 326/60; 326/59
[58] Field of Search ............................ 307/473–475, 307/443; 326/59–60, 34

[56] References Cited

U.S. PATENT DOCUMENTS

| | | | |
|---|---|---|---|
| 4,588,908 | 5/1986 | Reich et al. | 307/473 X |
| 4,631,428 | 12/1986 | Grimes | 307/473 X |
| 5,045,728 | 9/1991 | Crafts | 307/475 |

OTHER PUBLICATIONS

Posa, "Multivalued logic takes new paths", *Electronics*, vol. 4, No. 54, Feb. 1981, pp. 100–103.

*Primary Examiner*—David R. Hudspeth
*Attorney, Agent, or Firm*—Cushman, Darby & Cushman

[57] ABSTRACT

An interface circuit for reducing the number of data pins in an LSI circuit. The interface circuit, converts a multivalue input signal of a predetermined level into a binary value or converts a binary output signal into a multivalue of signal a predetermined level and is used as an interface for transferring data in LSI applications.

6 Claims, 4 Drawing Sheets

| x | y | A | B | C | D |
|---|---|---|---|---|---|
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

INTERFACE CIRCUIT USING A LIMITED NUMBER OF PINS IN LSI APPLICATIONS

FIELD OF THE INVENTION

The present invention relates to an interface circuit for transferring data across a limited number of pins in LSI applications.

BACKGROUND OF THE INVENTION

A higher scale of integration in an LSI circuit results in a circuitry per chip. Therefore, the number of input and output signals increases substantially, and it is impossible an avoid to increase in the number of pins. However, an increased number of pins can not be accommodated because of the size limitations of the LSI package.

SUMMARY OF THE INVENTION

The present invention solves the conventional problems and provides an interface circuit for transferring data across a limited number of pins in LSI applications.

An interface circuit according to the present invention reduces the number of pins for transferring data in LSI applications by converting a binarized signal into a binarized multivalue signal or a multivalue binarized signal.

PREFERRED EMBODIMENT OF THE PRESENT INVENTION

Hereinafter, an embodiment of the present invention is described with reference to the attached drawings.

Figures 2, 3:
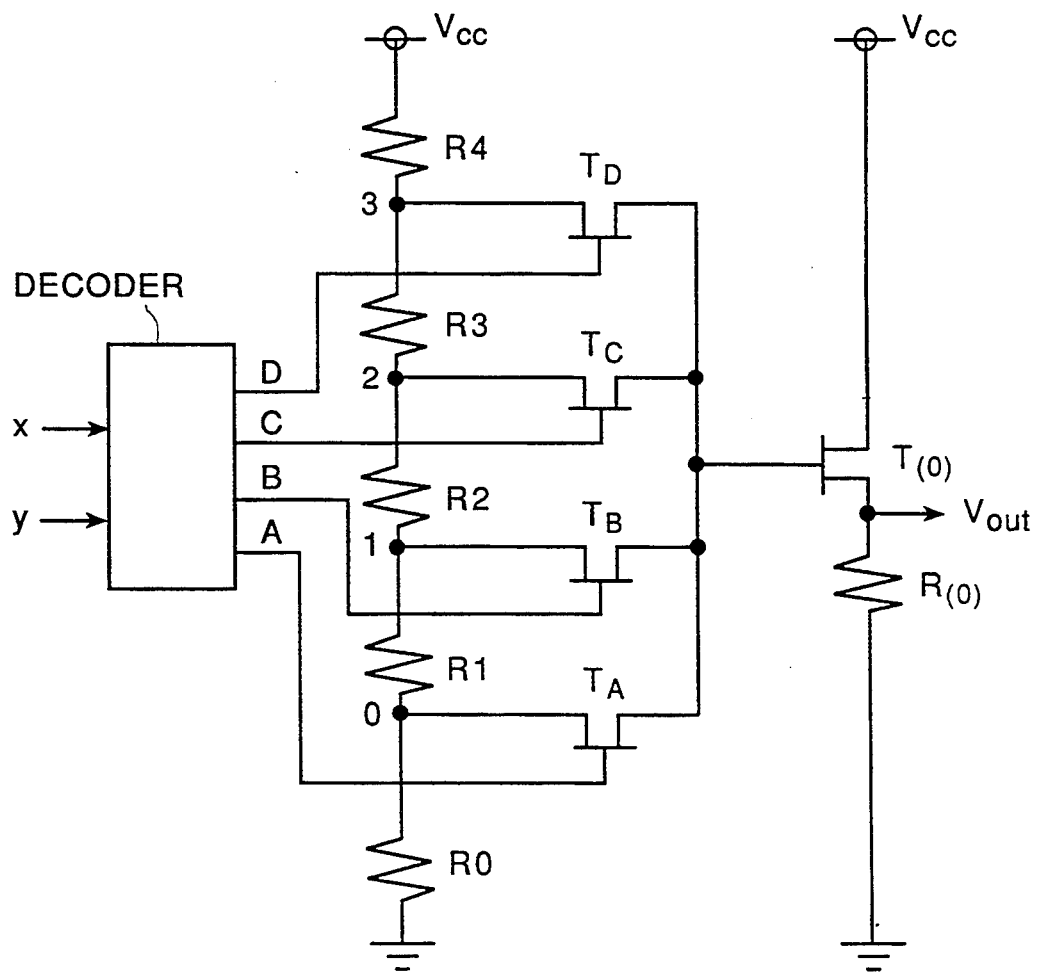
FIG. 2 is a block diagram of a first embodiment of a multivalue binarized value converting circuit.
FIG. 3 is a diagram explaining signal levels.

FIG. 2 is a block diagram of a binarized multivalue converting circuit. $T_A$, $T_B$, $T_C$ and $T_D$ are transistors connected in parallel, and R4, R3, R2, R1 and R0 are resistances. The source of $T_D$ is connected with a power source $V_{CC}$ through R4, the source of $T_C$ is connected with power source $V_{CC}$ through R4 and R3, the source of $T_B$ is connected with power source $V_{CC}$ through R4, R3 and R2 and one of $T_A$ is connected with a source $V_{CC}$ power through R4, R3, R2 and the R1. Here, R4 and R0 have same resistance value, and resistance value of R3, R2 and R1 are twice that of R4 or R0.

Signals x and y are binarized logical input signals. When signals x and y are at a low level (shown by "0" in FIG. 3), a decoder outputs signal A as a high level (shown by "1" in FIG. 3) and render only $T_A$ conductive. In this case, the voltage at node 0 is output as $V_{OUT}$ in a source follower circuit composed of $T_A$, $T(0)$ and $R(0)$.

In the case when x is "1" and y is "0", signal B is output as a high level and only $T_B$ is rendered conductive. The voltage at node 1 is output as $V_{OUT}$.

In the case when x is "0" and y is "1", signal C is output as a high level, and only $T_C$ is rendered conductive. The voltage at node 2 is output as $V_{OUT}$.

In the case when x and y are "1", signal D is output as a high level, and only $T_D$ is rendered conductive. The voltage at node 3 is output as $V_{OUT}$.

In this circuit, when one of signals A, B, C or D is "1", voltage $V_{OUT}$ is as follows.

Signal A: $0 \leq V_{OUT} < \frac{1}{4} V_{CC}$
Signal B: $\frac{1}{4} V_{CC} \leq V_{OUT} < 2/4 V_{CC}$
Signal C: $2/4 V_{CC} \leq V_{OUT} < \frac{3}{4} V_{CC}$
Signal D: $\frac{3}{4} V_{CC} \leq V_{OUT} < V_{CC}$ Then, 2 bits of data on 2 lines can be expressed by 4 values, each value corresponding to a voltage level.

Figure 6:
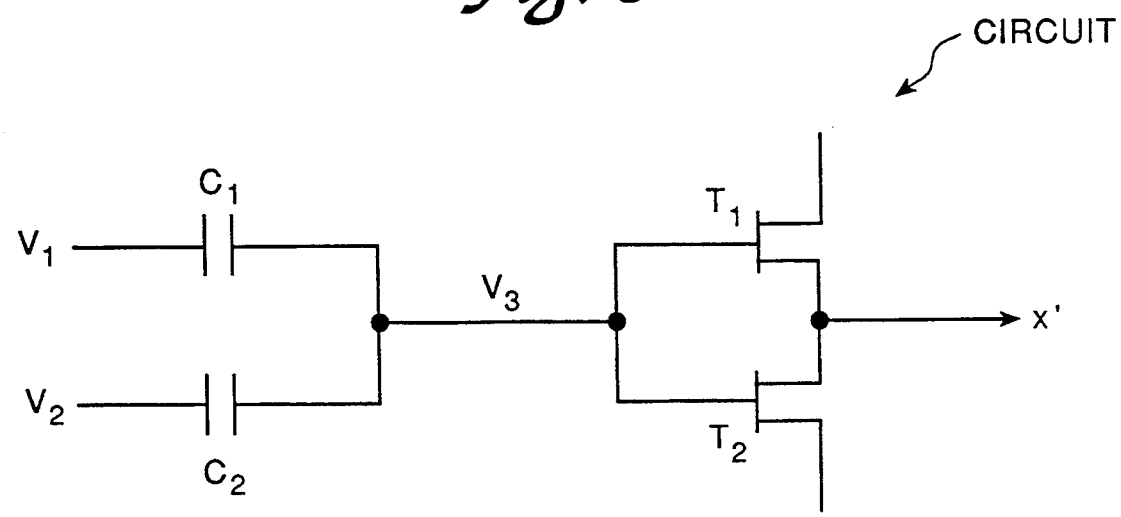
FIG. 6 is a diagram explaining a circuit with switch characteristics.

In the circuit of FIG. 6, $V_1$ and $V_2$ are input voltages, $C_1$ and $C_2$ are capacitors. $T_1$ is NMOS transistor and $T_2$ is a PMOS transistor. If $C_1$ is equal to $C_2$, then voltage $V_3$ is shown by $$V_3 = \frac{C_1 V_1 + C_2 V_2}{C_1 + C_2} = \frac{V_1 + V_2}{2} \quad (1)$$

If a threshold voltage of transistors $T_1$ and $T_2$ is defined as $V_T$, then a signal x' is "1" if $V_3$ is smaller than $V_T$ and is "0" if $V_3$ is more than $V_T$. Thus, the circuit of FIG. 6 has the characteristics of a switch.

Figures 4, 5:
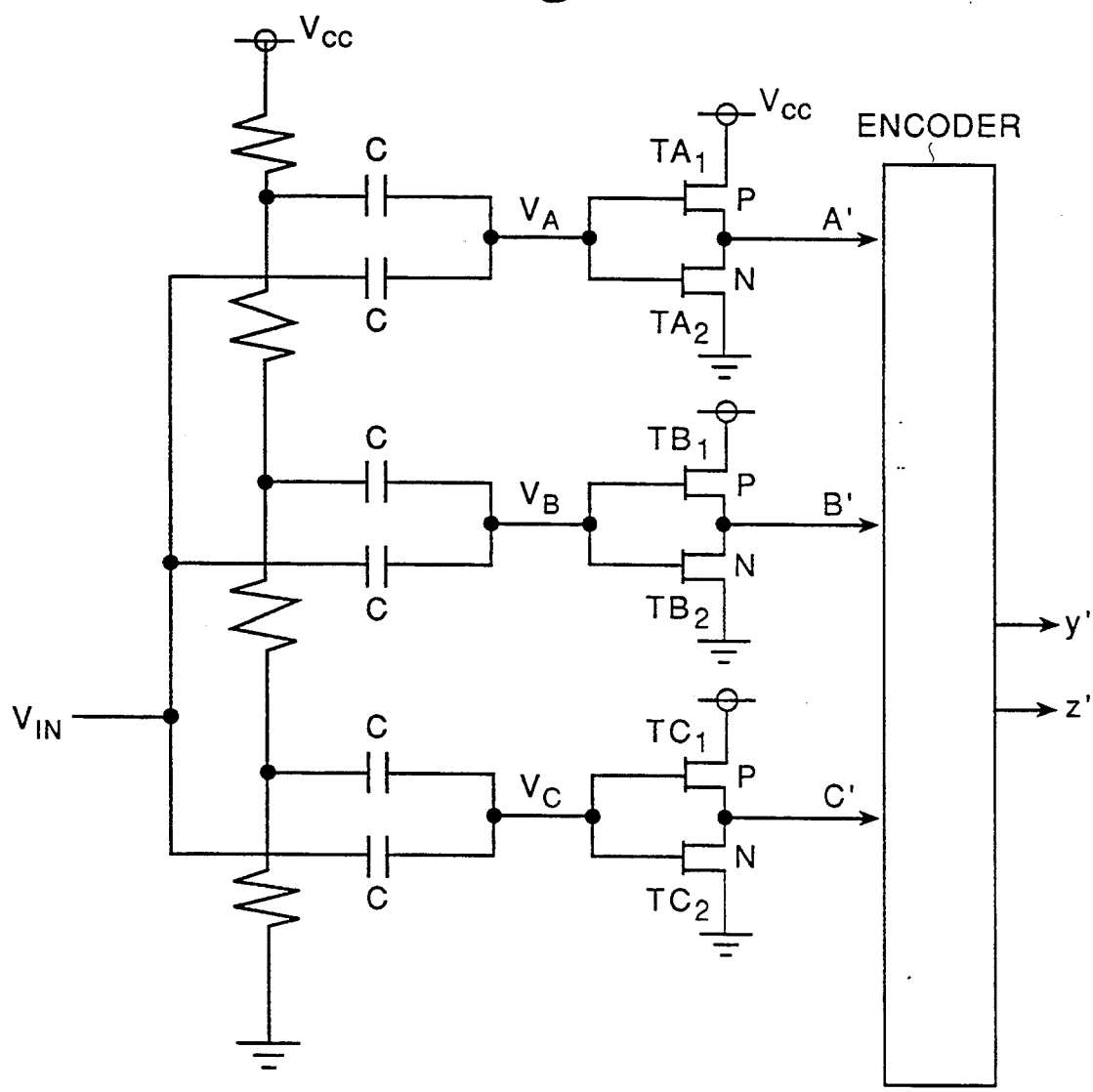
FIG. 4 is a block diagram of a second embodiment of a multivalue binarized value converting circuit.
FIG. 5 is a diagram explaining signal levels.

The circuit shown in FIG. 4 includes a plurality of circuits having the same composition as in FIG. 6 connected in parallel.

Here, if a threshold voltage of each transistor is defined as $\frac{1}{2} V_{CC}$, based on formula 1, voltages $V_A$, $V_B$ and $V_C$ are defined as formulas 2, 3 and 4.

$$V_A = \frac{3/4 V_{CC} + V_{IN}}{2} \quad (2)$$

$$V_B = \frac{2/4 V_{CC} + V_{IN}}{2} \quad (3)$$

$$V_C = \frac{1/4 V_{CC} + V_{IN}}{2} \quad (4)$$

When input voltage $V_{IN}$ is smaller than $\frac{1}{4} V_{CC}$, then all signals A', B' and C' are "1". When $V_{IN}$ is more than $\frac{1}{4} V_{CC}$, but less than 44 $V_{CC}$, then only signal A' is "0". When $V_{IN}$ is more than 2/4 $V_{CC}$, but less than $\frac{3}{4} V_{CC}$ then signals A' and B' are "0". When $V_{IN}$ is more than $\frac{3}{4} V_{CC}$, then all signals A', B' and C' are "0".

When all signals A', B' and C' are "1", then the encoder sets the signal levels of y' and z' as "0". When only signal A' is "0", then y' is "1" and z' is "0". When signals A' and B' are "0", then y' is "0" and z' is "1". If all signals A', B' and C' are "0", then y' and z' are "1".

Thus, it is possible to convert the representation of 2 bits of data from 4 valves on one line into two binary data lines.

FIG. 5 shows the relationship between signals A', B' and C' and signals y' and z'.

Figure 1:
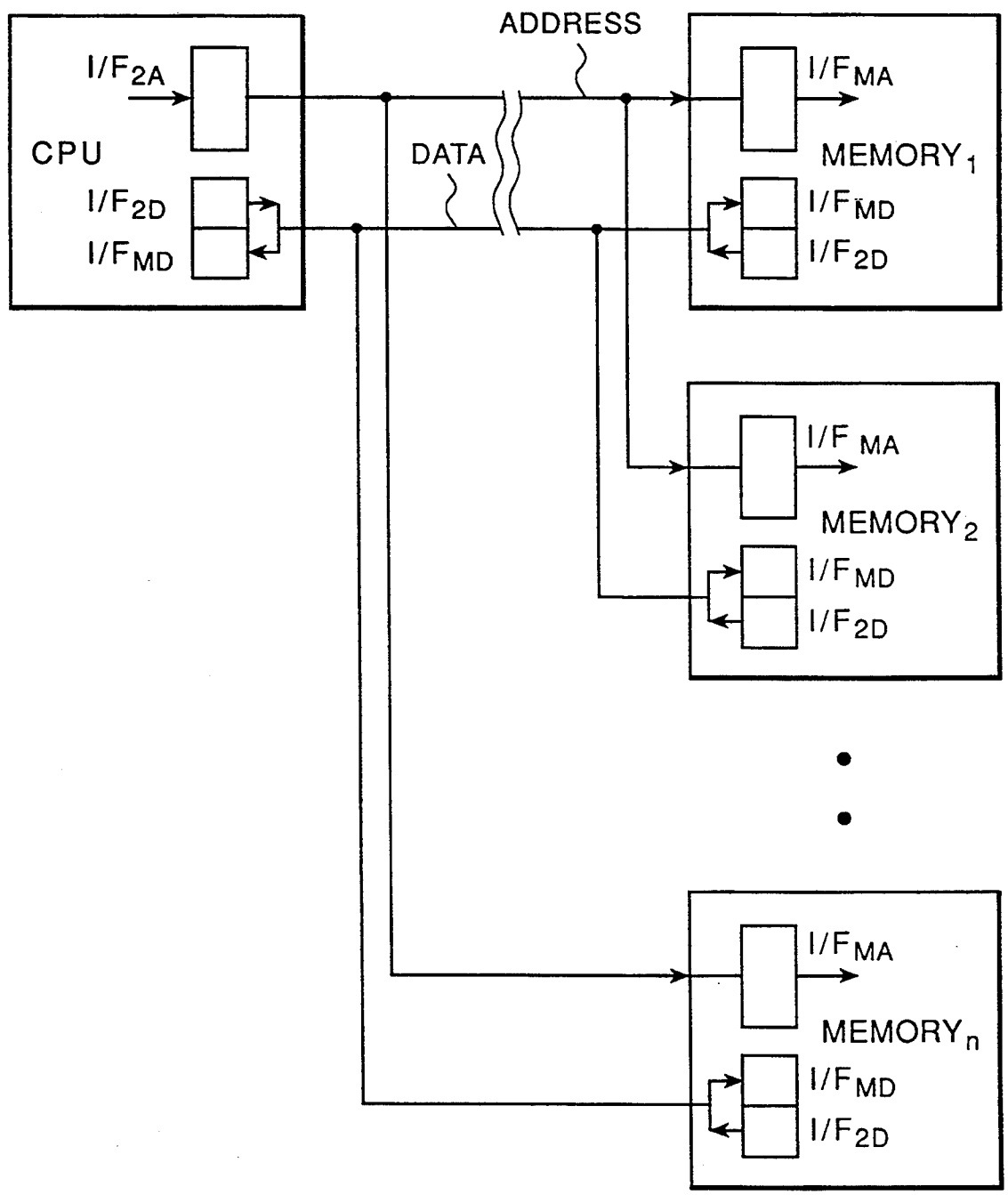
FIG. 1 is a circuit between LSI circuits using the present invention.

FIG. 1 shows a group of LSI circuit interconnected on a circuit board, each have interface circuits for translating data signals from binary to multivalue and multivalue to binary. By using the interface circuits, it is possible to reduce the number of pins needed.

In FIG. 1, $I/F_{2A}$ is a binary to multivalue interface circuit for an address signal. $I/F_{MA}$ is a multivalue to binary interface circuit for an address signal. $I/F_{MD}$ is a multivalue to binary interface circuit for a data signal.

Insides of the CPU chip and each memory chip are binary logic circuits. A binary address signal used by the CPU is converted into a multivalue signal through $I/F_{2A}$. An output signal is converted into a binary signal through $I/F_{MA}$ of memory 1 and stored in memory$_1$.

A binary data signal used in the CPU is converted into a multivalue signal through $I/F_{2A}$.

Output multivalue data is converted into binary data through converter $I/F_{MA}$ and it is stored in memory 1.

When binary data stored at memory$_1$ is processed by the CPU, binary to multivalue converting is performed by $I/F2D$ of memory$_1$ and the signal is processed by the CPU after multivalue to binary converting by $I/F_{MD}$.

Therefore it is possible to reduce the number of lines between a CPU and memory.

As mentioned above, an interface circuit according to the present invention makes it possible to reduce the number of input/output pins for LSI circuits and to thereby limit package size.

What is claimed is:

1. An integrated circuit including an interface circuit disposed therein, said interface circuit comprising:

first converting means, disposed within said integrated circuit, for converting an input signal to said integrated circuit having a voltage within one of at least four ranges into a binary signal, and second converting means, disposed within said integrated circuit, for converting a binary output signal from said integrated circuit into a signal having a voltage within one of at least four ranges.

2. An interface circuit comprising:

i) means for receiving a plurality of binary input signals;

ii) a decoder for generating a signal corresponding to a value represented by said binary input signals; and iii) a plurality of voltage sources; and iv) a plurality of transistors, each having a first terminal connected to one of said voltage sources, respectively, a second terminal connected to a common output terminal and a control terminal responsive to said signal generated by said decoder.

3. An interface circuit comprising:

i) means for receiving a multivalue input signal;

ii) a first plurality of capacitances each having one terminal connected to said receiving means and another terminal connected to a corresponding one of a plurality of switch nodes;

iii) a resistor network connected to a power source having a plurality of nodes at different voltages;

iv) a second plurality of capacitances, each having one terminal connected to one of said nodes, respectively, and a second terminal connected to a corresponding one of said plurality of switch nodes, respectively;

iv) a plurality of switches, each controlled by a voltage level at one of said plurality of switch nodes, for selectively supplying a corresponding signal level; and v) an encoder for receiving said signal levels and generating a plurality of corresponding binary signals.

4. An integrated circuit including an interface circuit disposed therein, said interface circuit comprising:

means for receiving a plurality of binary input signals;

a decoder for generating a decoder output corresponding to a value represented by said binary input signals;

means for generating a voltage signal having a voltage level corresponding to said decoder output;

means for receiving a multivalue voltage signal;

means for selectively supplying a source voltage to one or more of a plurality of encoder lines in accordance with said multivalue voltage signal; and an encoder for receiving said encoder lines and generating a plurality of binary signals.

5. The integrated circuit of claim 4, wherein said means for generating a voltage signal includes:

a plurality of transistors, each connected between one of a corresponding plurality of voltage sources and an output terminal such that said decoder output causes one of said plurality of transistors to conduct.

6. The integrated circuit of claim 4, wherein said means for selectively supplying a source voltage includes:

a first plurality of capacitances connected between said receiving means and a corresponding plurality of switch nodes;

a second plurality of capacitances, each having a first terminal connected to one of a corresponding plurality of voltage sources and a second terminal connected to a corresponding one of said switch nodes; and a plurality of switches for selectively connecting a source voltage to one or more of said plurality of encoder lines in response to a voltage level at each of said plurality of switch nodes.

* * * * *